(12) United States Patent
Hiroki et al.

(10) Patent No.: US 8,519,614 B2
(45) Date of Patent: Aug. 27, 2013

(54) LIGHTING DEVICE

(75) Inventors: Masaaki Hiroki, Kanagawa (JP);
Satoshi Seo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 15 days.

(21) Appl. No.: 13/371,408

(22) Filed: Feb. 11, 2012

(65) Prior Publication Data

US 2012/0206031 A1      Aug. 16, 2012

(30) Foreign Application Priority Data

Feb. 14, 2011  (JP) .................................. 2011-028871

(51) Int. Cl.
*H01J 1/63*  (2006.01)
*H01J 7/24*  (2006.01)

(52) U.S. Cl.
USPC ........................................ 313/504; 313/506

(58) Field of Classification Search
USPC ............... 313/495–512; 315/169.3, 169.4; 257/40, 79, 72, 181.1, 194; 345/30, 36, 44–45; 428/690
See application file for complete search history.

(56) References Cited

U.S. PATENT DOCUMENTS

| | | | |
|---|---|---|---|
| 7,999,463 B2 | 8/2011 | Nomura | |
| 2006/0211325 A1* | 9/2006 | Murakami et al. | 445/24 |
| 2008/0135085 A1 | 6/2008 | Corrales et al. | |
| 2008/0135086 A1 | 6/2008 | Corrales | |
| 2009/0302731 A1 | 12/2009 | Takamura | |
| 2011/0101401 A1 | 5/2011 | Aratani et al. | |
| 2011/0240098 A1 | 10/2011 | Corrales et al. | |

FOREIGN PATENT DOCUMENTS

| | | |
|---|---|---|
| EP | 2 302 981 A1 | 3/2011 |
| JP | 2002-343559 | 11/2002 |
| JP | 2004-127705 | 4/2004 |
| JP | 2004-179088 | 6/2004 |
| JP | 2006-236744 | 9/2006 |
| JP | 2006-351314 | 12/2006 |
| KR | 2002-0068562 | 8/2002 |
| WO | WO 2009/154168 A1 | 12/2009 |
| WO | WO 2010/032758 A1 | 3/2010 |

OTHER PUBLICATIONS

European Search Report re application No. EP 12155430.7, dated May 14, 2012.

* cited by examiner

*Primary Examiner* — Anh Mai
*Assistant Examiner* — Elmito Breval
(74) *Attorney, Agent, or Firm* — Husch Blackwell LLP

(57) ABSTRACT

The lighting device includes a substrate, a light-emitting element formed over one of surfaces of the substrate, and a rear surface metal layer formed on another surface of the substrate, which is opposite to the surface over which the light-emitting element is formed. The light-emitting element has a structure in which an organic compound layer containing a light-emitting substance is provided between a pair of electrodes. The substrate has a layered structure of an organic insulating layer and a metal layer including at least one internal metal layer. The internal metal layer is thermally bonded to the rear surface metal layer through a via hole formed in the organic insulating layer. The resistance of the via hole is lower than that in the case of thermal bonding not through the via hole.

38 Claims, 8 Drawing Sheets

502  501  500

LIGHTING DEVICE

BACKGROUND OF THE INVENTION

1. Field of the Invention

The present invention relates to a lighting device manufactured using a light-emitting element in which a light-emitting layer containing an organic compound is provided between a pair of electrodes.

2. Description of the Related Art

In recent years, a light-emitting element (also referred to as an electroluminescent (EL) element) in which a light-emitting layer (hereinafter also referred to as an EL layer) containing an organic compound is interposed between a pair of electrodes has been actively developed. Lighting has attracted attention as one of application fields of the light-emitting element. This is because a lighting device including an EL element has features different from those of other lighting devices; for example, the lighting device including the EL element can be thin and lightweight, and perform surface emission.

In addition, an EL element has attracted attention also in terms of its high efficiency of conversion from power into light and its high potential for saving energy. It is also a unique feature of an EL element that, depending on a substrate selected, it is possible to provide a lighting device having flexibility, a lighting device having high resistance against an impact such as physical destruction, or a very lightweight lighting device.

Unfortunately, a lighting device including an EL element has a significant problem in its life. This is partly because an EL element is significantly deteriorated by factors which accelerate deterioration, such as moisture and oxygen. Further, a lighting device which performs surface emission continuously in a large area has a problem of heat generation even when the lighting device includes an EL element with high power conversion efficiency. Such a temperature increase accelerates deterioration.

When flexibility, impact resistance, and weight reduction are demanded, these problems become more severe. Generally, a glass substrate is used for formation of an EL element. Having low impact resistance, little flexibility, and heavy weight, a glass substrate also has a superior gas barrier property and thus can effectively block factors for deterioration, such as water and oxygen in an outside atmosphere, which makes it possible to manufacture a long-life EL lighting device. In contrast, a resin substrate used for adding flexibility, increasing impact resistance, and reducing weight has an inferior gas barrier property; thus, an EL element is deteriorated rapidly as compared to the case of using a glass substrate.

Also proposed is an organic light-emitting display formed using a metal substrate as a substrate having both favorable sealing performance and a countermeasure against heat generation (for example, see Patent Document 1).

REFERENCE

[Patent Document 1] Japanese Published Patent Application No. 2006-351314

SUMMARY OF THE INVENTION

Improvement in the appearance such as the form and the design of a lighting device including an EL element by full utilization of the characteristics is greatly expected and demanded. Therefore, it is desired that an external input terminal and a wiring be provided so as not to be seen as much as possible. When size reduction can be achieved by provision of an integrated circuit such as a converter, the lighting device can be improved in design.

In terms of the design, the cost, and the like, a substrate formed using an organic insulating film such as a plastic resin, which can be formed and processed easily, is very easy to handle. However, as described above, a resin substrate has an inferior gas barrier property, so that an EL element manufactured using a resin substrate might be significantly deteriorated, which is a problem.

In addition, since an organic insulating film generally has low thermal conductivity, there is a concern that heat might accelerate deterioration of a lighting device to perform surface emission continuously in a large area.

In view of the above problems, it is an object of the present invention to provide a highly reliable lighting device which is advantageous in terms of reductions in cost and size and an improvement in design.

The present inventors found that a lighting device having the following structure can solve the above problems. The lighting device includes a substrate, a light-emitting element formed over one of surfaces of the substrate, and a rear surface metal layer formed on another surface of the substrate, which is opposite to the surface over which the light-emitting element is formed. The light-emitting element has a structure in which an organic compound layer containing a light-emitting substance is provided between a pair of electrodes. The substrate has a layered structure of at least one organic insulating layer and at least one internal metal layer, where the organic insulating layer and the internal metal layer are adjacent to each other in a direction in which they are stacked. The internal metal layer is thermally bonded to the rear surface metal layer through a via hole formed in the organic insulating layer. The via hole has lower thermal resistance than the internal metal layer and the rear surface metal layer which are thermally bonded to each other with the organic insulating layer interposed therebetween, not through the via hole.

The lighting device having the above structure in which the substrate is formed using an organic insulating material is advantageous in terms of reductions in cost and size and an improvement in design. In addition, owing to the internal metal layer and the rear surface metal layer, even the substrate formed using the organic insulating material can have a gas barrier property, so that deterioration of the light-emitting element due to deterioration factors, such as water and oxygen in an outside atmosphere, can be suppressed. Further, since the internal metal layer and the rear surface metal layer are thermally bonded through the via hole with low thermal resistance, heat generated by the light-emitting element can be released to the outside effectively, resulting in suppression of acceleration of deterioration of the light-emitting element due to heat.

One embodiment of the present invention is a lighting device having another structure. The lighting device includes a substrate, a light-emitting element formed over one of surfaces of the substrate, and a rear surface metal layer formed on another surface of the substrate, which is opposite to the surface over which the light-emitting element is formed. The light-emitting element has a structure in which an organic compound layer containing a light-emitting substance is provided between a pair of electrodes. The substrate has a layered structure of at least one organic insulating layer and at least one internal metal layer, where the organic insulating layer and the internal metal layer are adjacent to each other in a direction in which they are stacked. Part of the internal metal layer is electrically connected to one of the electrodes of the light-emitting element and thermally bonded to the rear surface metal layer through a via hole formed in the organic insulating layer. The via hole has lower thermal resistance than the internal metal layer and the rear surface metal layer which are thermally bonded to each other with the organic insulating layer interposed therebetween, not through the via hole.

The lighting device having the above structure in which the substrate includes an organic insulating film is advantageous in terms of reductions in cost and size and an improvement in design. In addition, owing to the internal metal layer and the rear surface metal layer, the substrate including the organic insulating film can also have a gas barrier property, so that deterioration of the light-emitting element due to deterioration factors, such as water and oxygen in an outside atmosphere, can be suppressed. Further, since the internal metal layer and the rear surface metal layer are thermally bonded through the via hole with low thermal resistance, heat generated by the light-emitting element can be released to the outside effectively, resulting in suppression of acceleration of deterioration of the light-emitting element due to heat. Furthermore, since the internal metal layer is electrically connected to one of the electrodes of the light-emitting element, a dissipation effect of heat generated by the light-emitting element can be effectively achieved.

One embodiment of the present invention is a lighting device having another structure. The lighting device includes a substrate, a plurality of light-emitting elements formed over one of surfaces of the substrate, and rear surface metal layers formed on another surface of the substrate, which is opposite to the surface over which the plurality of light-emitting elements is formed. The plurality of light-emitting elements each has a structure in which an organic compound layer containing a light-emitting substance is provided between a pair of electrodes. The substrate has a layered structure of an organic insulating layer and metal layers including at least one internal metal layer. Part or the whole of the internal metal layer or the rear surface metal layer is part of a wiring for feeding current to the light-emitting element. The internal metal layer is electrically connected to one of the electrodes of the light-emitting element and electrically connected to the rear surface metal layer through a via hole formed in the organic insulating layer. The internal metal layers and the rear surface metal layers are electrically isolated from each other according to at least the voltage of the electrode of the light-emitting element.

The lighting device having the above structure in which the substrate is formed using an organic insulating material is advantageous in terms of reductions in cost and size and an improvement in design. In addition, owing to the internal metal layer and the rear surface metal layer, even the substrate formed using the organic insulating material can have a gas barrier property, so that deterioration of the light-emitting element due to factors for deterioration, such as water and oxygen in an outside atmosphere, can be suppressed. Further, since the internal metal layer, one of the electrodes of the light-emitting element, and the rear surface metal layer are electrically connected to one another, a dissipation effect of heat generated by the light-emitting element can be achieved effectively, resulting in suppression of acceleration of deterioration of the light-emitting element due to heat. Furthermore, appropriate wiring connection allows light emission and non-light-emission of the plurality of light-emitting elements to be controlled independently.

One embodiment of the present invention is a lighting device having another structure. The lighting device includes a substrate, a plurality of light-emitting elements formed over one of surface of the substrate, and rear surface metal layers formed on another surface of the substrate, which is opposite to the surface over which the plurality of light-emitting elements is formed. The plurality of light-emitting elements each has a structure in which an organic compound layer containing a light-emitting substance is provided between a pair of electrodes. The substrate has a layered structure of an organic insulating layer and a metal layers including at least one internal metal layer. Part or the whole of the internal metal layer or the rear surface metal layer is part of a wiring for feeding current to the light-emitting element. The internal metal layer is electrically connected to one of the electrodes of the light-emitting element and electrically connected to the rear surface metal layer through a via hole formed in the organic insulating layer. The internal metal layers and the rear surface metal layers are separated between the light-emitting elements.

The lighting device having the above structure in which the substrate includes an organic insulating film is advantageous in terms of reductions in cost and size and an improvement in design. In addition, owing to the internal metal layer and the rear surface metal layer, even the substrate formed using the organic insulating film can have a gas barrier property, so that deterioration of the light-emitting element due to factors for deterioration, such as water and oxygen in an outside atmosphere, can be suppressed. Further, since the internal metal layer, one of the electrodes of the light-emitting element, and the rear surface metal layer are electrically connected to one another, a dissipation effect of heat generated by the light-emitting element can be achieved effectively, resulting in suppression of acceleration of deterioration of the light-emitting element due to heat. Furthermore, since currents flowing to the plurality of light-emitting elements can be individually controlled, illuminance levels in a light-emitting state and a non-light-emitting state can be controlled in each light-emitting element.

In the lighting device having the above structure, according to one embodiment of the present invention, the substrate includes stacked layers, where at least one of the internal metal layer and the rear surface metal layer is provided in the direction in which the substrate is penetrated perpendicularly to the stacked layers.

The lighting device having the above structure, according to one embodiment of the present invention, includes the substrate where at least one metal layer having a superior gas barrier property is provided so that the distance between the metal layer and an outside atmosphere is shortest, between the outside atmosphere and the light-emitting element in the direction in which the substrate is penetrated; so that the lighting device can have a long life.

In the lighting device having the above structure, according to one embodiment of the present invention, separation areas of the internal metal layer and the rear surface metal layer which are perpendicularly adjacent to each other or separation areas of the internal metal layers which are perpendicularly adjacent to each other, overlap with each other orthogonally or substantially orthogonally when the substrate is seen from the direction perpendicular to the stacked layers.

An object of the lighting device having the above structure, according to one embodiment of the present invention, is to avoid overlapping of the separation areas in which the metal layers are not formed. When the object is achieved, the gas barrier property can be improved and the life can be increased.

In the lighting device having the above structure, according to one embodiment of the present invention, at least the bottom surface or the top surface of the via hole is coated with a material having higher thermal conductivity than the organic insulating film.

In the lighting device having the above structure, according to one embodiment of the present invention, the via hole is filled with a material having higher thermal conductivity than the organic insulating film.

When at least the top surface or the bottom surface of the via hole is coated with the material having high thermal conductivity, heat transfer efficiency is enhanced, leading to an improvement in a heat dissipation effect. Accordingly, acceleration of deterioration of the light-emitting element due to heat can be suppressed.

In the lighting device having the above structure, according to one embodiment of the present invention, the internal metal layer is electrically connected to one of the electrodes of the light-emitting element through the via hole, and the surface of the substrate, over which the light-emitting element is formed, is flat.

In the lighting device according to one embodiment of the present invention, the internal metal layer is electrically connected to one of the electrodes of the light-emitting element through the via hole, and the one of the electrodes of the light-emitting element has a surface which is flat and parallel to the surface of the substrate.

One embodiment of the present invention is the lighting device in which the flat surface is obtained by mechanical polishing.

In the lighting device having the above structure, according to one embodiment of the present invention, the occurrence of a problem such as a short circuit due to defective formation of the light-emitting element can be suppressed; thus, manufacturing yield of the lighting device can be increased.

In the lighting device according to one embodiment of the present invention, the rear surface metal layer has an uneven surface.

In the lighting device having the above structure, according to one embodiment of the present invention, the area of the surface of the rear surface metal layer is large, so that efficiency of diffusing heat to the air is favorable, leading to an increase of the life.

In the lighting device according to one embodiment of the present invention, an external connection terminal is formed using the internal metal layer or the rear surface metal layer.

In the lighting device according to one embodiment of the present invention, an external connection terminal is formed using the internal metal layer and the rear surface metal layer.

In the lighting device having the above structure, according to one embodiment of the present invention, the external connection terminal is formed on a surface of the substrate, which is different from the surface over which the light-emitting element is formed, such as a side surface of the substrate or a surface which is opposite to the surface over which the light-emitting element is formed, whereby the effective emission area in a light-emitting surface of the lighting device can be increased.

In the lighting device according to one embodiment of the present invention, the rear surface metal layer is separated by separation areas into a plurality of island shapes corresponding to the light-emitting elements connected to the separated island-shaped rear surface metal layers. The areas of the separated island-shaped rear surface metal layers vary depending on the position.

In the lighting device according to one embodiment of the present invention, part of the rear surface metal layer is provided with a heat sink. The heat sink may be thermally bonded to the rear surface metal layer with an electric conductor or an electrically-insulating heat conductor interposed therebetween.

In the lighting device having the above structure, according to one embodiment of the present invention, a heat dissipation effect can be achieved with the heat sink.

In the lighting device according to one embodiment of the present invention, a portion where separated island-shaped rear surface metal layers are densely concentrated is provided with a heat sink with an electrically-insulating heat conductor interposed therebetween.

In the lighting device according to one embodiment of the present invention, an integrated circuit is provided so as to overlap with a heat sink, on a portion where an insulating heat conductor is not provided, when the substrate is seen from the direction perpendicular to the stacked layers.

In the lighting device having the above structure, according to one embodiment of the present invention, portions where heat of the light-emitting element is released are concentrated; thus, heat dissipation allows the rear surface except for a portion provided with the rear surface metal layer to be used for other purposes (e.g., providing an external connection terminal, an integrated circuit, and equipment for mounting).

In the lighting device according to one embodiment of the present invention, an insulating film is formed so as to cover the rear surface metal layer.

In the lighting device according to one embodiment of the present invention, part or the whole of the internal metal layer or the rear surface metal layer is part of a path for feeding current to the light-emitting element.

In the lighting device having such a structure, the internal metal layer or the rear surface metal layer is used as a wiring; thus, the degree of flexibility in the circuit configuration and the arrangement is increased.

In the lighting device according to one embodiment of the present invention, the substrate is a printed circuit board.

The lighting device having the above structure, according to one embodiment of the present invention, which includes the EL element and has high added value, can be manufactured using a known mature technique.

The lighting device according to one embodiment of the present invention has a high degree of flexibility in the arrangement of a wiring, an input terminal, an integrated circuit, and the like and high reliability. Further, a lighting device according to one embodiment of the present invention is highly reliable and advantageous in terms of the manufacturing cost.

DETAILED DESCRIPTION OF THE INVENTION

Figure 1A:
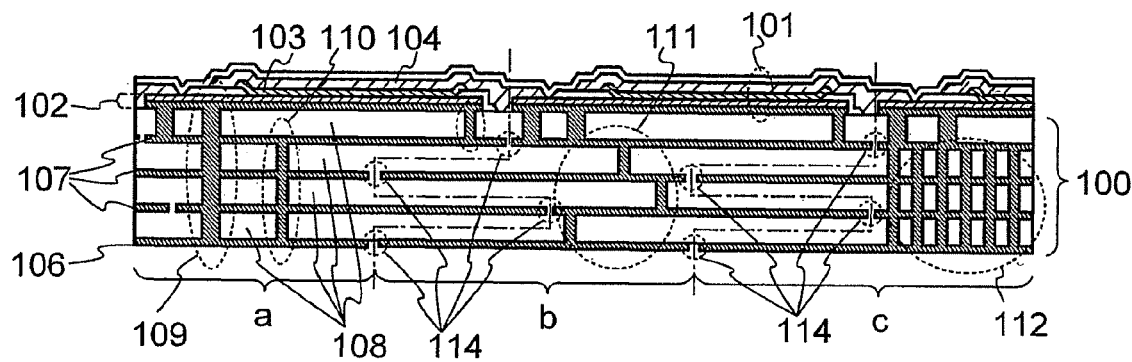
FIGS. 1A to 1C each illustrate a structure of a lighting device according to one embodiment of the present invention.

Hereinafter, embodiments of the present invention will be described with reference to the accompanying drawings. However, the present invention can be carried out in many different modes, and it is easily understood by those skilled in the art that modes and details of the present invention can be modified in various ways without departing from the spirit and the scope of the present invention. Therefore, the present invention is not construed as being limited to description of the embodiments.

Note that for the sake of simplification, the magnification ratio and the reduction ratio of each component in drawings are not fixed, and, thus the ratios of the thicknesses, the lengths, and the sizes of components in the drawings are not necessarily reflected on the ratios of the thicknesses, the lengths, and the sizes of a lighting device according to one embodiment of the present invention.

Embodiment 1

Figure 1B:
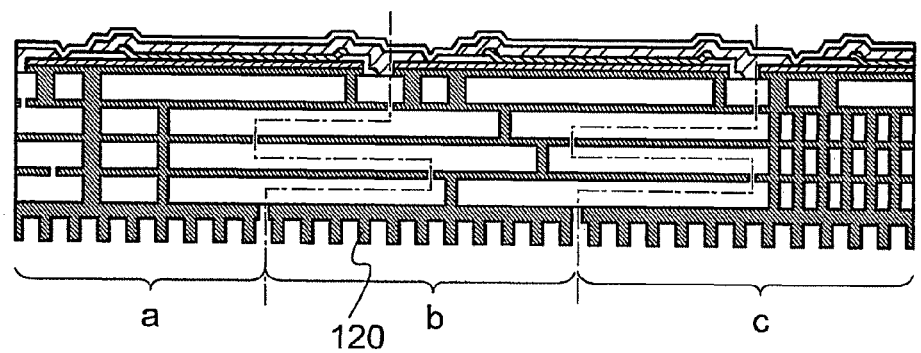
Figure 1C:
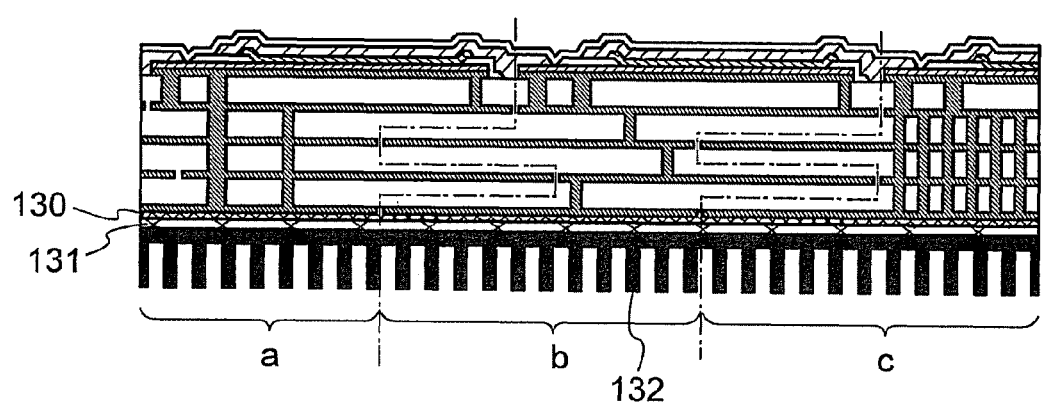

FIGS. 1A to 1C are schematic cross-sectional views each illustrating a lighting device according to one embodiment of the present invention. Note that parts of the lighting devices according to embodiments of the present invention are shown here. In FIG. 1A, an EL element 101 is formed over a surface of a substrate 100. The EL element 101 in which an organic compound layer 103 containing a light-emitting substance is provided between a first electrode 102 and a second electrode 104 emits light when a current flows between the first electrode 102 and the second electrode 104. The lighting device may include either a plurality of EL elements or one EL element. In the case where the lighting device includes a plurality of EL elements, the EL elements may be connected in series as illustrated in the drawing. Alternatively, the EL elements may be connected in parallel or in a series-parallel connection. Still alternatively, EL elements may be isolated from each other.

A rear surface metal layer 106 is formed on a surface of the substrate 100, which is opposite to the surface provided with the EL element 101. Further, the substrate 100 has a layered structure of an organic insulating layer 108 and at least one internal metal layer 107. FIG. 1A illustrates an example where three internal metal layers 107 are stacked; however, one embodiment of the present invention is not limited thereto. The internal metal layer 107 and the rear surface metal layer 106 may be formed using a conductive metal such as aluminum (Al), silver (Ag), copper (Cu), gold (Au), platinum (Pt), nickel (Ni), tungsten (W), chromium (Cr), molybdenum (Mo), iron (Fe), cobalt (Co), or palladium (Pd), a nitride of a metal material (e.g., titanium nitride), or the like. It is preferable to use a material with high electric conductivity and high thermal conductivity, such as aluminum (Al) or copper (Cu).

For the organic insulating layer 108, for example, a resin, a material in which a base material such as glass cloth or glass fiber is impregnated with a resin may be used. As the resin, epoxy, polyimide, polyethylene terephthalate, polyethersulfone, polyethylene naphthalate, polycarbonate, nylon, polyetheretherketone, polysulfone, polyetherimide, polyarylate, polybutylene terephthalate, or the like can be used.

Since the substrate 100 has a layered structure of the organic insulating layer 108 and the metal layers as described above, it is possible to obtain the lighting device according to one embodiment of the present invention which is easy to process and is advantageous in improving its design. Further, the lighting device according to one embodiment of the present invention can be lightweight. Furthermore, the lighting device according to one embodiment of the present invention can be manufactured at low cost. In addition, the lighting device according to one embodiment of the present invention can also have flexibility. As the substrate having a layered structure of the organic insulating layer 108 and the metal layers, a printed circuit board may alternatively be used.

The internal metal layers 107, and the internal metal layer 107 and the rear surface metal layer 106 are thermally bonded to each other through via holes 109, 110, 111, and 112 formed in the substrate 100. The via hole 109 has thermal resistance lower than at least the thermal resistance of the internal metal layers 107 thermally bonded to each other through the organic insulating layers 108 and the thermal resistance of the internal metal layer 107 and the rear surface metal layer 106 thermally bonded to each other through the organic insulating layers 108. Accordingly, heat generated by the EL element can be effectively transferred to the rear surface metal layer 106, so that generated heat can be dissipated into the air or any other medium by the rear surface metal layer 106. Thus, deterioration of a light-emitting element due to heat can be suppressed. Since electrical connection means thermal bonding, when the EL element is electrically connected to the internal metal layer 107 or the rear surface metal layer 106, a heat dissipation effect can be achieved and thus deterioration due to heat can be suppressed.

As a simple structure with low thermal resistance, a structure where the via holes are filled with a material with thermal conductivity higher than that of the organic insulating layer 108. Although the via holes are not necessarily filled with such a material completely, the thermal resistance of the via holes needs to be lower than that in the case of bonding through the organic insulating layers 108. For example, even when the side surfaces and at least either the bottom surfaces or the top surfaces of the via holes are coated with a material with high thermal conductivity, there is no problem as long as the thermal resistance of the via holes is lower than that in the case of bonding through the organic insulating layers 108. Similarly, even when only the side surfaces of the via holes are coated with a material with high thermal conductivity and a slight air layer exists between the internal metal layers or between the internal metal layer and the rear surface metal layer, there is no problem as long as the thermal resistance of the whole via holes is lower than that in the case of bonding through the organic insulating layers 108. A material used in the via holes is not limited as long as it has thermal conductivity higher than that of the organic insulating layer 108; an insulating thermal conductor can be used other than a conductor such as a metal material. Note that a material with higher thermal conductivity is preferable, and a metal material is preferable as such a material. As the metal material, any of materials given as those of the internal metal layer 107 and the rear surface metal layer 106, or the like can be used.

Note that the heat dissipation effect is improved when the internal metal layer 107 is electrically connected to an electrode (the first electrode 102) of the EL element 101 on the substrate side; thus, the above structure is preferable.

The rear surface metal layer 106 may be flat as in FIG. 1A; however, it is preferable that a surface of the rear surface metal layer 106 be provided with an uneven structure 120 as in FIG. 1B because the surface area increases and thus heat can be dissipated into the air or any other medium effectively. To achieve a similar effect, a so-called heat sink 132 formed using a material with high thermal conductivity typified by aluminum may be additionally provided on the rear surface metal layer 106 as in FIG. 1C. The heat sink 132 may be provided with an adhesive with thermal conductivity or a sheet 131 provided between the substrate 100 and the heat sink 132. The adhesive or the sheet 131 and the heat sink 132 may be provided after an insulating film 130 is formed.

To form the via holes, a plurality of layers may be penetrated at a time as in the case of the via holes 109 and 110 in a region a in FIG. 1A. As in the case of the via holes 111 in a region b in FIG. 1A, the via holes may be formed in the layers so as not to overlap with each other. As in the case of the via holes 112 in a region c in FIG. 1A, many via holes may be formed. In the region a and the region c in FIG. 1A, a stack to be penetrated is formed, and then, the via holes are formed by laser irradiation or physical perforation such as punching. After that, connecting (bonding) materials may be deposited at least on the wall surfaces of the via holes by any of a variety of methods such as plating, sputtering, vacuum evaporation, and coating. In the region b in FIG. 1A, the via holes can be formed separately in the layers and connecting (bonding) materials inside the via holes can be deposited separately in the layers. The via holes and the connecting (bonding) materials may be formed and deposited by methods similar to those in the case of the region a in FIG. 1A. Although at least the wall surfaces of the via holes need to be coated with connecting (bonding) materials, it is preferable to coat the top surfaces or the bottom surfaces of the via holes with connecting (bonding) materials. It is further preferable to fill the via holes with connecting (bonding) materials completely because the heat dissipation effect can be achieved more favorably. Note that in the drawings, via holes of a plurality of modes are formed in one lighting device for the sake of convenience; however, it is preferable to form via holes of one mode in a lighting device in terms of simplicity. It is needless to say that a plurality of modes of via holes may be formed.

When the first electrode 102 of the EL element, the internal metal layers 107, and the rear surface metal layer 106 are electrically connected and the lighting device includes the plurality of EL elements, it is preferable that the internal metal layers 107 and the rear surface metal layer 106 be separated for electrical isolation at least according to the potential of the metal layers and the first electrode 102. It is further preferable that the internal metal layers 107 and the rear surface metal layer 106 be separated between the EL elements. In such cases, currents flowing to the plurality of EL elements can be individually controlled, so that illuminance levels in a light-emitting state and a non-light-emitting state can be controlled in each EL element. Further, even when one of the EL elements has a problem such as a short circuit, it is possible to prevent other EL elements from being adversely affected. FIG. 1A illustrates the structure in which respective EL elements are connected in the region a, the region b, and the region c and the internal metal layers 107 and the rear surface metal layer 106 are divided by separation areas 114. That is to say, part of the internal metal layers 107 and part of the rear surface metal layer 106 in the region a, those in the region b, and those in the region c are electrically isolated from each other.

Here, since the metal film is not formed in the separation areas 114, there is no gas barrier property in the separation areas 114. Thus, the separation areas 114 are formed in the metal layers so as not to concentrate in one portion. In other words, when the substrate is penetrated perpendicularly, at least one of the metal layers including the rear surface metal layer needs to be left. Accordingly, even when the separation areas 114 are formed in the metal layer, it is possible to suppress significant degradation of the gas barrier property of the substrate 100; therefore, the lighting device can have a long life.

Water and a gas to cause deterioration such as oxygen, which enters through the separation areas 114, reach the EL element through the organic insulating layers 108 because they are not able to pass through the metal layer. Therefore, the separation areas 114 are preferably formed so that the path of water and such a gas is as long as possible. When the length of the path can be longer than the thickness of the substrate, at least an effect of increasing the life can be achieved.

Some of the separation areas 114 in the different metal layers cross each other when seen from above the top surface of the substrate. It is preferable that they cross each other orthogonally or substantially orthogonally so that the area of such an overlapping portion is as small as possible. Note that "orthogonal" and "substantially orthogonal" in this case mean that the angle formed by two of the separation areas 114 is approximately 45° to 135°. Maximal reduction in the area of the overlapping portion of the separation areas 114 allows the gas barrier property to be kept favorable.

Figure 2:
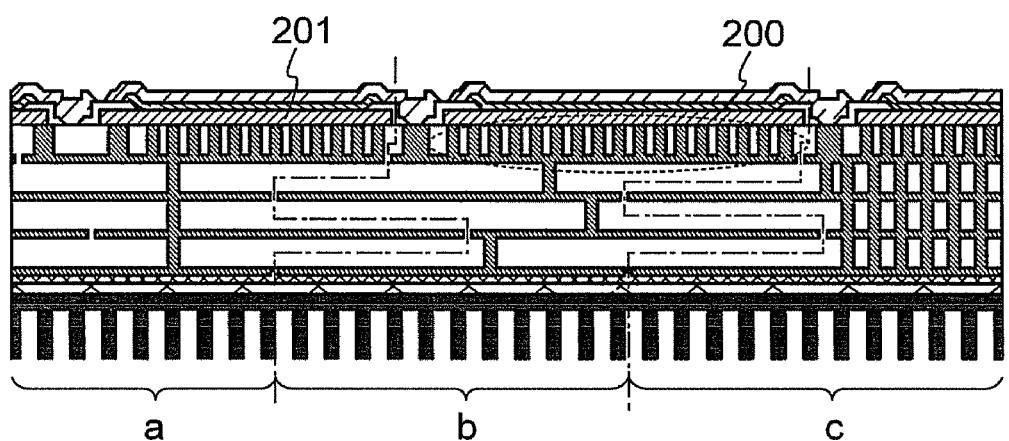
FIG. 2 illustrates a structure of a lighting device according to one embodiment of the present invention.

Since the via holes provided with connecting materials and the periphery are generally uneven to a greater or lesser extent, it is preferable to form the via holes outside an emission region of the EL element to prevent a defect such as a short circuit due to the unevenness. Note that a far superior heat dissipation effect can be achieved when the via holes are in contact with the first electrode 201 of the EL element like the via holes 200 in FIG. 2. When a surface of the substrate is planarized by mechanical polishing such as CMP (chemical mechanical polishing) after via holes are formed, the via holes 200 can be formed under the first electrode 201, while occurrence of a defect such as a short circuit is suppressed. Consequently, a far superior heat dissipation effect can be achieved.

Figure 3:
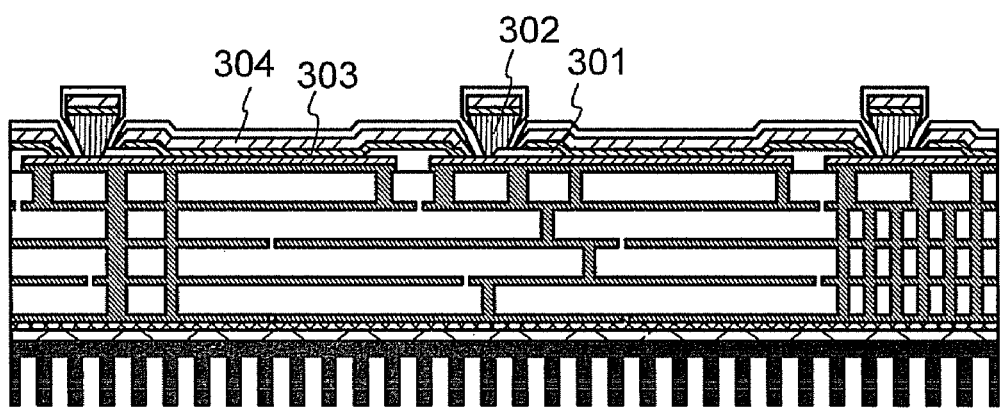
FIG. 3 illustrates a structure of a lighting device according to one embodiment of the present invention.

FIG. 3 illustrates a structure of a lighting device similar to the above lighting device, which can be obtained with the use of reduced number of masks when inverse tapered partition walls are used. An insulating film 301 is formed over a first electrode of an EL element and then, inverse tapered partition walls 302 are formed so that part of the top portion of the inverse tapered partition wall 302 is over the insulating film 301 and part of the inverse tapered partition wall 302 is over the first electrode. These inverse tapered partition walls can be formed similarly to those used for passive matrix EL displays. After that, an EL layer 303 is formed by a highly anisotropic deposition method such as a vacuum evaporation method or a long throw sputtering method, and a second electrode 304 is formed by a deposition method which allows favorable coverage, such as a sputtering method. Through the above steps; the second electrode 304 is formed so that it extends further than the EL layer 303 to a portion under the top surface of the partition wall 302; thus, the second electrode 304 can be connected to the first electrode and the EL elements can be connected in series. By the above method, the lighting device where the plurality of EL elements are connected in series can be manufactured without using a mask after formation of the partition walls 302.

Figure 4A:
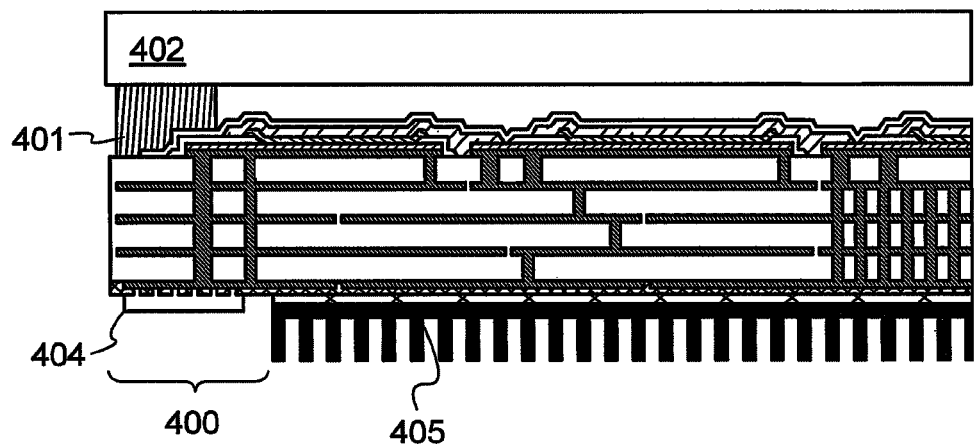
FIGS. 4A to 4C each illustrate a structure of a lighting device according to one embodiment of the present invention.
Figure 4B:
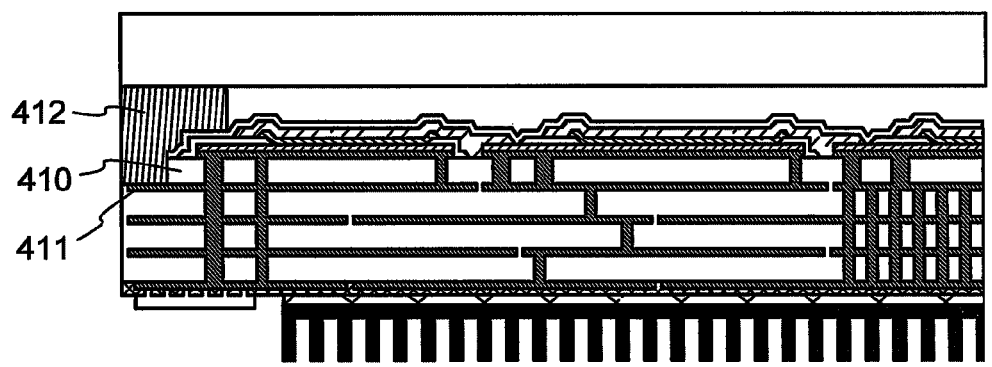
Figure 4C:
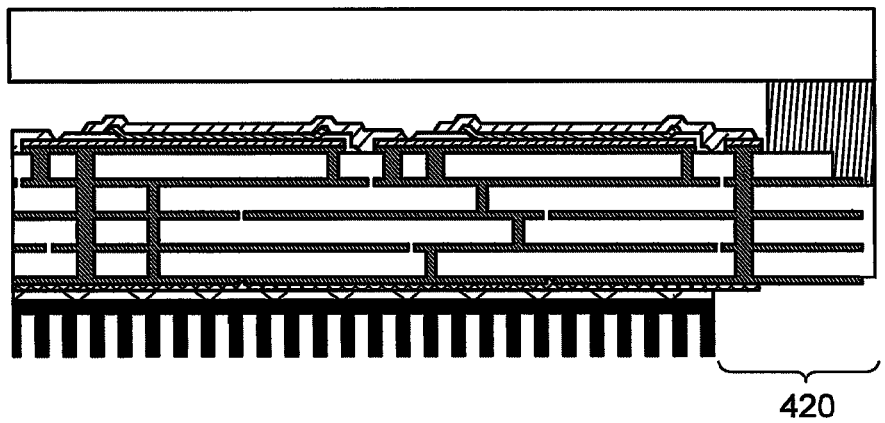

FIGS. 4A to 4C each illustrate a structure in which an external connection terminal is provided on a rear surface metal layer. The external connection terminal and the like can be provided in a region 400 where a heat sink 405 is not provided as in FIG. 4A. It is necessary to perform sealing with the use of a sealant 401 and a sealing substrate 402 to shield a lighting device including an EL element from an outside atmosphere. Conventionally, a region where the external connection terminal is provided has been needed outside an emission region because it is necessary to provide the external connection terminal outside such a sealed region. In contrast, when the external connection terminal is provided on the rear surface metal layer as in this embodiment, the area of a region which does not contribute to light emission can be reduced. That is, the degree of flexibility in the arrangement of the external connection terminal can be increased, leading to a reduction in size, an improvement in design, and the like. Accordingly, a lighting device with better design can be provided. Moreover, an integrated circuit 404 such as a converter can be provided in the region 400, allowing further reduction in size.

Further, part or all of the internal metal layers and the rear surface metal layer can be used as part of a path for feeding current to the EL element, that is, as a wiring. Thus, the degree of flexibility in the circuit configuration and the arrangement is increased, leading to reduction in size.

FIG. 4B illustrates another sealing method. In FIG. 4B, an example is shown in which sealing is performed in such a manner that a first layer of organic insulating layers 410 is partly removed so that a first layer of internal metal layers 411 is exposed, and a sealant 412 is formed thereover. When this method is employed, the layer of the organic insulating layers 410 which is closest to the EL element is not exposed to an outside atmosphere, which enables provision of a more highly reliable lighting device. Although only the first layer of the organic insulating layers is partly removed in FIG. 4B, second and third layers of the organic insulating layers may also be removed in a similar manner.

FIG. 4C illustrates another end portion. In a region 420, an external connection terminal or an integrated circuit may be provided.

It is also possible to provide an external connection terminal on a side surface of a substrate (a surface perpendicular to or substantially perpendicular to a surface over which an EL element is formed). An external connection terminal can be provided on a side surface of a substrate in such a manner that a conductive material is deposited on the side surface of the substrate so as to be electrically connected to an internal metal layer and/or a surface metal layer extended to the edge of the substrate.

The provision of an external connection terminal on a surface of a substrate, over which an EL element is not formed, allows an increase in the degree of flexibility in the configuration and the arrangement of a wiring and a circuit; thus, a lighting device which is advantageous in terms of a reduction in size, an improvement of the design, or the like can be achieved.

Figure 5:
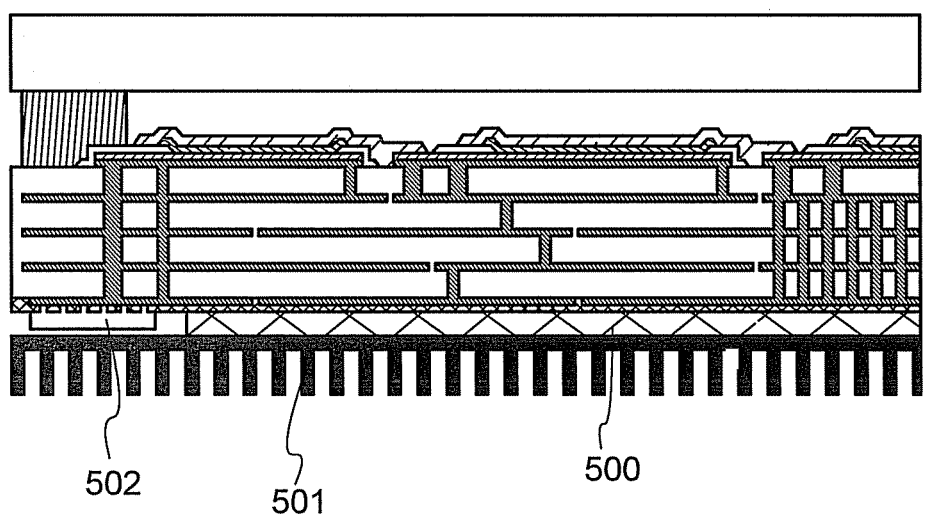
FIG. 5 illustrates a structure of a lighting device according to one embodiment of the present invention.

FIG. 5 illustrates an example in which an external connection terminal or an integrated circuit is provided between a heat sink and a substrate. When a substrate is provided with a heat sink 501 with a member 500 having thermal conductivity interposed therebetween, an increase in thickness of the member 500 with thermal conductivity enables provision of an integrated circuit 502 or the like between the heat sink and the substrate. Since the rear surface metal layer is formed using a material with high thermal conductivity, a heat dissipation effect can be achieved effectively when the member 500 with thermal conductivity overlaps with at least part of the rear surface metal layer separated between the EL elements (may overlap therewith an insulating layer interposed therebetween) as in FIG. 5. Therefore, the external connection terminal or the integrated circuit can be provided in a portion not provided with the member 500 with thermal conductivity as in FIG. 5. A far superior heat dissipation effect can be achieved as the area of the heat sink increases; thus, when the heat sink is formed also on the external connection terminal or the integrated circuit, the area of a lighting device can be maximized to obtain also a superior heat dissipation effect. Further, in that case, the rear surface metal layers connected to the EL elements are concentrated in one portion and the member with thermal conductivity is formed on part of the substrate, whereby collected heat of the EL elements can be effectively transferred to the heat sink. That is, concentration of a heat dissipation portion in one portion allows the rest to be freely utilized; thus, the degree of flexibility in the circuit configuration and the arrangement is further increased. Since the rear surface metal layers are concentrated in one portion in this case, the sizes of the rear surface metal layers vary among the EL elements in some cases. In such a manner, a heat dissipation effect is achieved utilizing the rear surface metal layers; thus, it is possible to increase the degree of flexibility in a heat dissipation structure.

As the substrate 100 in this embodiment, a printed circuit board may be used. The use of a printed circuit board makes it possible to obtain a lighting device having the structure and the effect described above easily with an established technique.

The lighting device having the above structure according to this embodiment can have a high degree of flexibility in the arrangement of a wiring, an input terminal, an integrated circuit, and the like and high reliability.

The EL element 101 will be described below with reference to FIGS. 6A and 6B. One of a pair of electrodes of the first electrode 102 and the second electrode 104 included in the EL element functions as an anode 702 and the other functions as a cathode 704. The EL element in this embodiment is a top-emission lighting device which emits light in the direction opposite to the substrate 100; thus, the second electrode 104 is formed using a material which transmits a visible light. The first electrode 102 is preferably formed using a material with high reflectivity so that light emitted in the direction of the first electrode 102 can also be effectively extracted.

As a material of the electrode serving as an anode, a material having a high work function (specifically, a work function of higher than or equal to 4.0 eV) is preferably used. As such a material, gold (Au), platinum (Pt), nickel (Ni), tungsten (W), chromium (Cr), molybdenum (Mo), iron (Fe), cobalt (Co), copper (Cu), palladium (Pd), titanium (Ti), a nitride of a metal material (for example, titanium nitride), and the like can be given. Other than the above, a conductive metal oxide having a light-transmitting property, such as indium oxide ($In_2O_3$), an indium oxide-tin oxide alloy ($In_2O_3$—$SnO_2$: also referred to as ITO), an indium oxide-zinc oxide alloy ($In_2O_3$—$ZnO$), or zinc oxide ($ZnO$), zinc oxide to which gallium is added may be used. Films of these conductive metal oxides are usually formed by sputtering; however, a sol-gel method or the like may be used. When the second electrode 104 is used as an anode, the second electrode 104 may be formed to have a small thickness to transmit light or the above metal oxide having a light-transmitting property may be used. Note that with use of a composite material described later for a surface which is in contact with an anode of the EL layer 103, an electrode material can be selected regardless of its work function.

As a material of the electrode serving as a cathode, a material having a low work function (specifically, a work function of lower than or equal to 3.8 eV) is preferably used. As specific examples of such a cathode material, metals belonging to Group 1 or 2 of the periodic table, that is, alkali metals such as lithium (Li) and cesium (Cs); alkaline earth metals such as calcium (Ca) and strontium (Sr); magnesium (Mg); an alloy containing any of the above metals (e.g., MgAg or AlLi); rare earth metals such as europium (Eu) and ytterbium (Yb); an alloy containing such a rare earth metal; aluminum; an aluminum alloy; and the like are given. When the second electrode 104 is used as a cathode, such a material is deposited thin so that light can be transmitted sufficiently, to form a transparent conductive film. After the material is deposited so that light can be transmitted, the above metal oxide having a light-transmitting property is stacked thereover to form the second electrode 104. Note that an alkali metal, an alkaline earth metal, a compound thereof, or a substance exhibiting an electron-transport property to which a substance exhibiting an electron-donating property with respect to the substance exhibiting an electron-transport property (hereinafter referred to as a material having a donor level) is added is used for the cathode of the EL layer 103; thus, the electrode material can be selected regardless of its work function. In other words, an oxide transparent conductive film typified by ITO can be used as a material of the cathode. With the use of a charge-generation layer formed by stacking a layer formed using a composite material and a layer formed using a material having a donor level, a similar effect can be obtained (note that in that case, the layer formed using the composite material is in contact with the cathode).

Alternatively, a light-transmitting conductive macromolecule may be used for the anode. As the conductive macromolecule, for example, a π-electron conjugated conductive macromolecule such as polyaniline or a derivative thereof, polypyrrole or a derivative thereof, polythiophene or a derivative thereof, or a copolymer of two or more kinds of these materials can be used.

The first electrode 102 and the second electrode 104 can each be formed by a known method, for example, a sputtering method, a vacuum evaporation method, an ion plating method, a molecular beam epitaxy (MBE) method, a CVD method (a metal organic CVD (MOCVD) method or an atomic layer deposition (ALD) method), a sol-gel method, a spin coating method, a dipping method, a spray method, a coater method, or a printing method, depending on a material used.

There is no particular limitation on the layered structure of the EL layer 103. The EL layer 103 may be formed by appropriately combining functional layers such as a light-emitting layer, an electron-transport layer containing a substance having a high electron-transport property, a hole-transport layer containing a substance having a high hole-transport property, an electron-injection layer containing a substance having a high electron-injection property, a hole-injection layer containing a substance having a high hole-injection property, and a bipolar layer containing a substance having a bipolar property (a substance having a high electron-transport property and a high hole-transport property). These functional layers other than the light-emitting layer are not necessarily provided and another functional layer may be provided. Note that such a layered structure is referred to as a light-emitting unit in some cases.

In this embodiment, a structure of the EL layer 103 which includes a hole-injection layer 711, a hole-transport layer 712, a light-emitting layer 713, an electron-transport layer 714, and an electron-injection layer 715 from the anode 702 side will be described (see FIG. 6A). A structure and a material of each layer will be specifically described below.

The hole-injection layer 711 is a layer which is provided in contact with the anode 702 and contains a substance with a high hole-injection property. As the substance having a high hole-injection property, for example, molybdenum oxide, vanadium oxide, ruthenium oxide, tungsten oxide, or manganese oxide can be used. Alternatively, any of the following may be used to form the hole-injection layer 711: phthalocyanine-based compounds such as phthalocyanine (abbreviation: $H_2Pc$) and copper phthalocyanine (abbreviation: CuPc); aromatic amine compounds such as 4,4'-bis[N-(4-diphenylaminophenyl)-N-phenylamino]biphenyl (abbreviation: DPAB) and N,N'-bis[4-[bis(3-methylphenyl)amino]phenyl]-N,N'-diphenyl-[1,1'-biphenyl]-4,4'-diamine (abbreviation: DNTPD); a macromolecule such as poly(3,4-ethylenedioxythiophene)/poly(styrenesulfonate) (PEDOT/PSS), and the like.

Alternatively, for the hole-injection layer 711, a composite material in which a substance exhibiting an acceptor property with respect to a substance having a high hole-transport property is contained in the substance having a high hole-transport property may be used. Note that when a layer of the composite material in which an acceptor substance is contained in a substance having a high hole-transport property is formed in contact with the anode, a material for forming the anode can be selected regardless of its work function. In other words, it is possible to use, for the anode, a material with a low work function as well as a material with a high work function. As the acceptor substance, 7,7,8,8-tetracyano-2,3,5,6-tetrafluoroquinodimethane (abbreviation: $F_4$-TCNQ), chloranil, and the like can be given. In addition, a transition metal oxide can be given. In addition, oxides of metals that belong to Group 4 to Group 8 of the periodic table can be given. Specifically, vanadium oxide, niobium oxide, tantalum oxide, chromium oxide, molybdenum oxide, tungsten oxide, manganese oxide, and rhenium oxide are preferable because they each have a high electron-accepting property. Among them, molybdenum oxide is especially preferable because it is stable in the air and its hygroscopic property is low and is easily handled.

As the substance having a high hole-transport property used for the composite material, any of a variety of compounds such as an aromatic amine compound, a carbazole derivative, aromatic hydrocarbon, and a macromolecular compound (e.g., an oligomer, a dendrimer, or a polymer) can be used. An organic compound used for the composite material preferably has a high hole-transport property. Specifically, a substance having a hole mobility of $10^{-6}$ $cm^2/Vs$ or higher is preferably used. However, any of substances other than the above materials may be used as long as the hole-transport property thereof is higher than the electron-transport property thereof. Organic compounds which can be used for the composite material will be specifically given below.

As aromatic amine compounds, for example, the following can be given: N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), N,N'-bis[4-[bis(3-methylphenyl)amino]phenyl]-N,N'-diphenyl-[1,1'-biphenyl]-4,4'-diamine (abbreviation: DNTPD), and 1,3,5-tris[N-(4-diphenylaminophenyl)-N-phenylamino]benzene (abbreviation: DPA3B).

As the carbazole derivative which can be used for the composite material, the following can be given specifically: 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), and the like.

In addition, as the carbazole derivative which can be used for the composite material, the following can also be given: 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 1,4-bis[4-(N-carbazolyl)phenyl]-2,3,5,6-tetraphenylbenzene, and the like.

Examples of the aromatic hydrocarbon which can be used for the composite material include 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis (4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, and 2,5,8,11-tetra(tert-butyl)perylene. Besides, pentacene, coronene, and the like can also be given. It is particularly preferable to use the aromatic hydrocarbon which has a hole mobility of $1×10^{-6}$ cm$^2$/Vs or higher and which has 14 to 42 carbon atoms.

The aromatic hydrocarbon which can be used for the composite material may have a vinyl skeleton. As the aromatic hydrocarbon having a vinyl group, the following can be given for example: 4,4'-bis(2,2-diphenylvinyl)biphenyl (abbreviation: DPVBi) and 9,10-bis[4-(2,2-diphenylvinyl)phenyl]anthracene (abbreviation: DPVPA).

Moreover, a macromolecular compound such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl) methacrylamide] (abbreviation: PTPDMA), or poly[N,N'-bis (4-butylphenyl)-N,N'-bis(phenyl)benzidine (abbreviation: poly-TPD) may be used.

Note that a layer formed using such a composite material can be very suitably used for optical design that is performed to control the light extraction efficiency, directivity, or the like of light emitted from the light-emitting layer because the driving voltage of the layer formed using the composite material hardly varies even when the layer is formed thick or thin.

The hole-transport layer 712 contains a substance having a high hole-transport property. As the substance having a high hole-transport property, the following can be given, for example: aromatic amine compounds such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4',4"-tris(N,N-diphenylamino)triphenylamine (abbreviation: TDATA), 4,4',4"-tris [N-(3-methylphenyl)-N-phenylamino]triphenylamine (abbreviation: MTDATA), and 4,4'-bis[N-(spiro-9,9'-bifluorene-2-yl)-N-phenylamino]biphenyl (abbreviation: BSPB). The substances mentioned here are mainly ones each have a hole mobility of $10^{-6}$ cm$^2$/Vs or higher. However, any of substances other than the above materials may be used as long as the hole-transport property thereof is higher than the electron-transport property thereof. The layer containing a substance with a high hole-transport property is not limited to a single layer, and two or more layers containing any of the above substances may be stacked.

For the hole-transport layer 712, a macromolecular compound such as poly(N-vinylcarbazole) (abbreviation: PVK) or poly(4-vinyltriphenylamine) (abbreviation: PVTPA) may alternatively be used.

The light-emitting layer 713 is a layer containing a light-emitting substance. The light-emitting layer 713 may be either a so-called light-emitting layer of a single film containing a luminescent center material as its main component or a so-called light-emitting layer of a host-guest type in which a luminescent center material is dispersed in a host material.

There is no particular limitation on the luminescent center material that is used, and a known fluorescent material or a known phosphorescent material can be used. As the fluorescent material, the following can be given, for example: N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), and other materials each having an emission wavelength of 450 nm or more, such as 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra-tert-butylperylene (abbreviation: TBP), 4-(10-phenyl-9-anthryl)-4'-(9-phenyl-9H-carbazol-3-yl)triphenylamine (abbreviation: PCBAPA), N,N''-(2-tert-butylanthracene-9,10-diyldi-4,1-phenylene)bis[N,N',N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N',N'',N'',N''',N'''-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N'-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij] quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), and 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJ™). As the phosphorescent material, the following can be given, for example: bis[2-(4',6'-difluorophenyl)pyridinato-N,C$^{2'}$]iridium(III)tetrakis(1-pyrazolyl)borate (abbreviation: FIr6), materials each having an emission wavelength in the range of 470 nm to 500 nm, such as bis[2-(4',6'-difluorophenyl)pyridinato-N,C$^{2'}$]iridium(III) picolinate (abbreviation: FIrpic), bis [2-(3',5'-bistrifluoromethylphenyl)pyridinato-N,C$^{2'}$]iridium (III) picolinate (abbreviation: Ir(CF$_3$ppy)$_2$(pic)), and bis[2-(4',6'-difluorophenyl)pyridinato-N,C$^{2'}$]iridium(III)

acetylacetonate (abbreviation: FIracac), materials each having an emission wavelength of 500 nm or more (materials which emit green light), such as tris(2-phenylpyridinato)iridium(III) (abbreviation: Ir(ppy)$_3$), bis(2-phenylpyridinato)iridium(III) acetylacetonate (abbreviation: Ir(ppy)$_2$(acac)), tris(acetylacetonato)(monophenanthroline)terbium(III) (abbreviation: Tb(acac)$_3$(Phen)), bis(benzo[h]quinolinato)iridium(III) acetylacetonate (abbreviation: Ir(bzq)$_2$(acac)), bis(2,4-diphenyl-1,3-oxazolato-N,C$^{2'}$)iridium(III) acetylacetonate (abbreviation: Ir(dpo)$_2$(acac)), bis[2-(4'-perfluorophenylphenyl)pyridinato]iridium(III) acetylacetonate (abbreviation: Ir(p-PF-ph)$_2$(acac)); bis(2-phenylbenzothiazolato-N,C$^{2'}$)iridium(III) acetylacetonate (abbreviation: Ir(bt)$_2$(acac)), bis[2-(2'-benzo[4,5-α]thienyl)pyridinato-N,C$^{3'}$]iridium(III) acetylacetonate (abbreviation: Ir(btp)$_2$(acac)), bis(1-phenylisoquinolinato-N,C$^{2'}$)iridium(III) acetylacetonate (abbreviation: Ir(piq)$_2$(acac)), (acetylacetonato)bis[2,3-bis(4-fluorophenyl)quinoxalinato]iridium(III) (abbreviation: Ir(Fdpq)$_2$(acac)), (acetylacetonato)bis(2,3,5-triphenylpyrazinato)iridium(III) (abbreviation: Ir(tppr)$_2$(acac)), 2,3,7,8,12,13,17,18-octaethyl-21H,23H-porphyrin platinum(II) (abbreviation: PtOEP), tris(1,3-diphenyl-1,3-propanedionato) (monophenanthroline)europium(III) (abbreviation: Eu(DBM)$_3$(Phen)), and tris[1-(2-thenoyl)-3,3,3-trifluoroacetonato](monophenanthroline)europium(III) (abbreviation: Eu(TTA)$_3$(Phen)). Any of the above materials and other known materials may be selected in consideration of the emission color of each EL element.

When a host material is used, for example, any of the following can be used: metal complexes such as tris(8-quinolinato)aluminum(III) (abbreviation: Alq), tris(4-methyl-8-quinolinato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ), heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2"-(1,3,5-benzenetriyl)-tris(1-phenyl-1H-benzimidazole) (abbreviation: TPBI), bathophenanthroline (BPhen), bathocuproine (abbreviation: BCP), and 9-[4-(5-phenyl-1,3,4-oxadiazol-2-yl)phenyl]-9H-carbazole (abbreviation: CO11), and aromatic amine compounds such as NPB (or a-NPD), TPD, and BSPB. Alternatively, any of condensed polycyclic aromatic compounds such as anthracene derivatives, phenanthrene derivatives, pyrene derivatives, chrysene derivatives, and dibenzo[g,p]chrysene derivatives may be used. Specific examples of the condensed polycyclic aromatic compound include 9,10-diphenylanthracene (abbreviation: DPAnth), N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), 4-(9H-carbazol-9-yl)-4'-(10-phenyl-9-anthryl)triphenylamine (abbreviation: YGAPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N,9-diphenyl-N-(9,10-diphenyl-2-anthryl)-9H-carbazol-3-amine (abbreviation: 2PCAPA), 6,12-dimethoxy-5,11-diphenylchrysene, N,N,N',N',N",N",N"',N"'-octaphenyldibenzo[g,p]chrysene-2,7,10,15-tetramine (abbreviation: DBC1), 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), and 3,3',3"-(benzene-1,3,5-triyl)tripyrene (abbreviation: TPB3). From these materials and other known materials, a material may be selected which has a larger energy gap (or a triplet energy if the material emits phosphorescence) than a luminescent center material dispersed in the material and which has a transport property as needed.

The electron transport layer 714 contains a substance having a high electron-transport property. For example, a layer including a metal complex having a quinoline skeleton or a benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]quinolinato)beryllium (abbreviation: BeBq$_2$), or bis(2-methyl-8-quinolinolato)(4-phenylphenolato)aluminum (abbreviation: BAlq), or the like can be used. Alternatively, a metal complex having an oxazole-based or thiazole-based ligand, such as bis[2-(2-hydroxyphenyl)benzoxazolato]zinc (abbreviation: Zn(BOX)$_2$) or bis[2-(2-hydroxyphenyl)benzothiazolato]zinc (abbreviation: Zn(BTZ)$_2$), or the like may be used. Other than the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like may be used. The substances mentioned here are mainly ones each have an electron mobility of $10^{-6}$ cm$^2$/Vs or higher. However, any of substances other than the above materials may be used for the electron-transport layer 714 as long as the electron-transport property is higher than the hole-transport property thereof.

The electron-transport layer 714 is not limited to a single layer, and two or more layers containing any of the above substances may be stacked.

Further, a layer for controlling transport of electrons may be provided between the electron-transport layer 714 and the light-emitting layer 713. Specifically, the layer for controlling transport of electrons is a layer formed by adding a small amount of substance having a high electron trapping property to the above material having a high electron-transport property, and is capable of adjusting carrier balance by suppressing transport of electron carriers. Such a structure is very effective in suppressing occurrence of a problem (such as shortening of the life of an element) due to electrons passing through the light-emitting layer 713.

For the electron-injection layer 715, an alkali metal, an alkaline earth metal, or a compound thereof, such as lithium fluoride (LiF), cesium fluoride (CsF), or calcium fluoride (CaF$_2$) can be used. Alternatively, a material in which a layer formed using a substance exhibiting an electron-transport property includes a substance exhibiting an electron-donating property (typically, an alkali metal, an alkaline earth metal, or a compound thereof) with respect to the substance exhibiting an electron-transport property (the material having a donor level), for example, a material in which Alq contains magnesium (Mg) can be used for the electron-injection layer 715. Note that the use of the material having a donor level for the electron-injection layer 715 is preferable because electron injection from the cathode 704 is effectively performed.

Figure 6A:
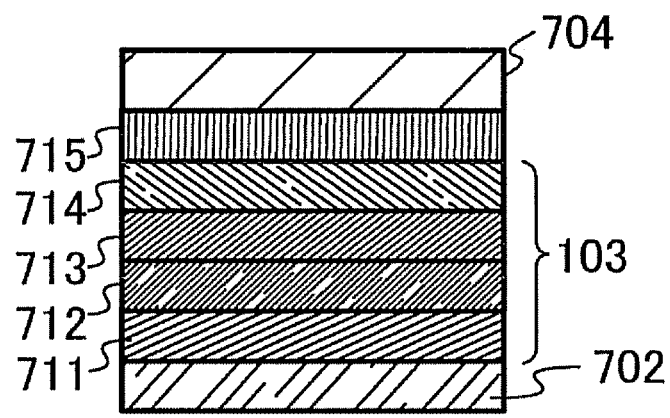
FIGS. 6A and 6B each illustrate a structure of an EL element.
Figure 6B:
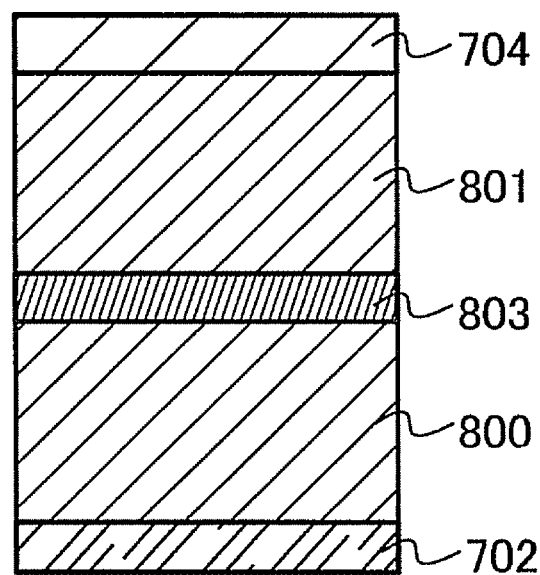

Note that the EL layer 103 may have a structure where a plurality of light-emitting units is stacked between the anode 702 and the cathode 704 as illustrated in FIG. 6B. In this case, a charge generation layer 803 is preferably provided between a first light-emitting unit 800 and a second light-emitting unit 801 which are stacked. The charge generation layer 803 can be formed with the use of the above composite material. Further, the charge generation layer 803 may have a layered structure including a layer containing the composite material and a layer containing another material. In this case, as the layer containing another material, a layer containing an electron donating substance and a substance with a high electron-transport property, a layer formed using a transparent conductive film, or the like can be used. An EL element having such a structure is less likely to involve problems such as energy transfer between the light-emitting units and quenching and has more choices of materials, thereby readily having both high light emission efficiency and a long life. It is also easy for such an EL element to exhibit phosphorescence from one of the light-emitting units and fluorescence from the other. Although FIG. 6B illustrates a structure in which two light-emitting units (the first light-emitting unit 800 and the second light-emitting unit 801) are stacked, three or more light-emitting units may be stacked. In such a case, charge-generation layers are preferably provided between the light-emitting units.

The light-emitting unit has a structure similar to the structure of the EL layer 103 in FIG. 6A, and may be formed by combining functional layers described as components of the EL layer in FIG. 6A as appropriate, such as a light-emitting layer, an electron-transport layer containing a substance having a high electron-transport property, a hole-transport layer containing a substance having a high hole-transport property, an electron-injection layer containing a substance having a high electron-injection property, a hole-injection layer containing a substance having a high hole-injection property, and a bipolar layer containing a substance having a bipolar property (a substance having a high electron-transport property and a high hole-transport property). These functional layers other than the light-emitting layer are not necessarily provided and another functional layer may be provided. The detailed description of these layers is given above and thus a repeated description thereof is omitted. The description of the EL layer 103 in FIG. 6A can be referred to.

The structure illustrated in FIG. 6B is particularly preferable for obtaining white light emission, and thus is effective particularly for lighting application. Accordingly, a high-quality lighting device can be provided.

Embodiment 2

In this embodiment, lighting devices each including a light-emitting device manufactured according to one embodiment of the present invention will be described with reference to FIG. 7 and FIG. 8.

Figure 7:
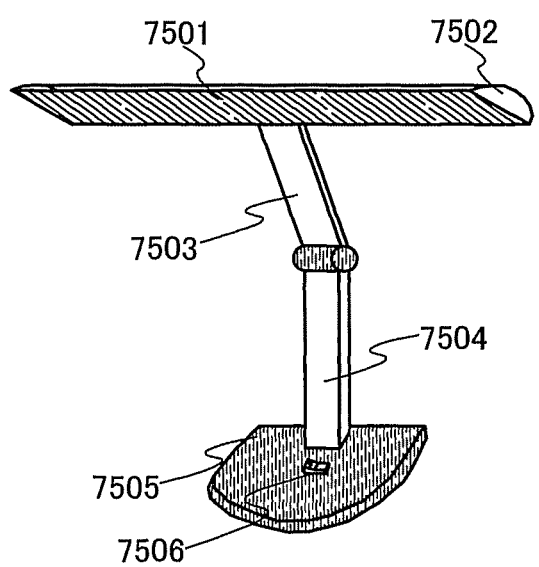
FIG. 7 illustrates a lighting device according to one embodiment of the present invention.

FIG. 7 illustrates a lighting device (desk lamp), which includes a lighting part 7501, a shade 7502, an adjustable arm 7503, a support 7504, a base 7505, and a power switch 7506. Note that the lighting device is manufactured using a light-emitting device, which is manufactured according to one embodiment of the present invention, for the lighting part 7501. Note that the term "lighting device" also encompasses ceiling lights (ceiling-fixed lighting devices), wall lights (wall-hanging lighting devices), and the like, as well as the desk lamp illustrated in FIG. 7.

A lighting device manufactured according to one embodiment of the present invention has a high degree of flexibility in the circuit configuration and the arrangement and a long life. Thus, when the lighting device is used for the lighting part 7501 of a lighting device (a desk lamp 3000), the lighting device (the desk lamp) can have high reliability and a good design. A lighting device manufactured according to one embodiment of the present invention is lightweight and has high impact resistance; thus, the lighting device which is lightweight and less likely to be broken can be provided.

Figure 8:
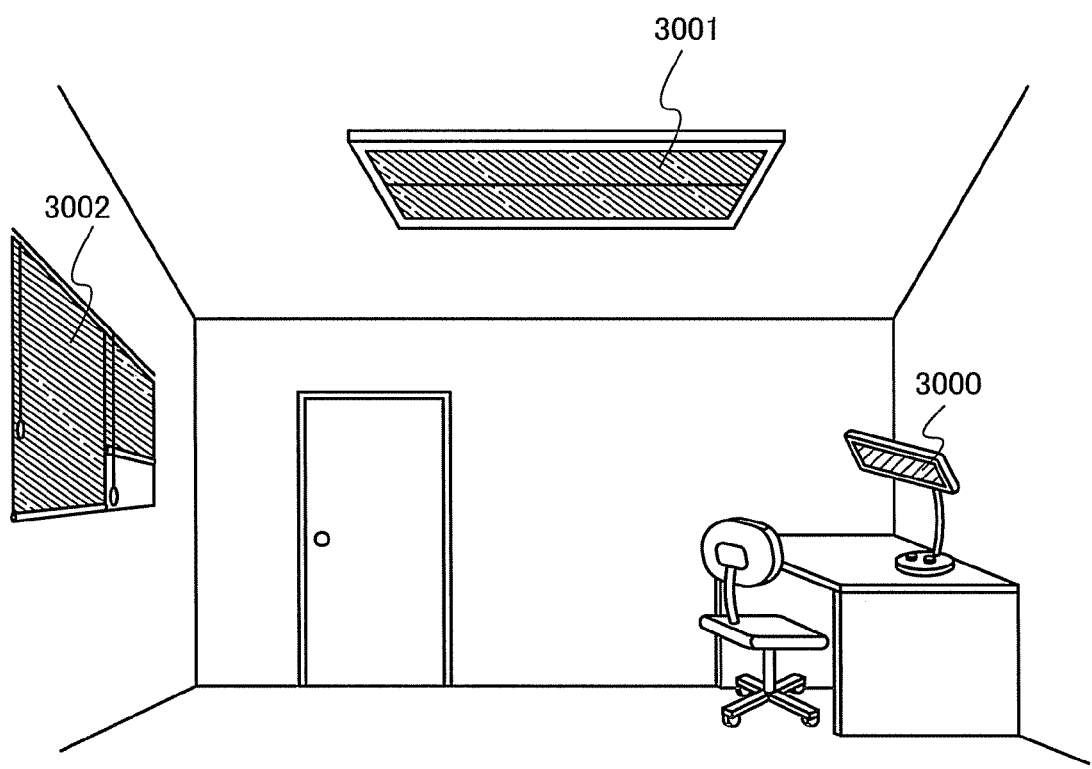
FIG. 8 illustrates lighting devices according to embodiments of the present invention.

FIG. 8 illustrates an example in which light-emitting devices to which, embodiments of the present invention are applied are used as interior lighting devices. The light-emitting device according to one embodiments of the present invention can have a long life and light weight, and thus can be used as a lighting device having a large area as illustrated by a ceiling lighting device 3001. Further, the light-emitting device can be used as a wall-hanging lighting device 3002. The light-emitting device or the lighting device manufactured according to one embodiment of the present invention has a high degree of flexibility in the circuit configuration and the arrangement of an external connection terminal, an integrated circuit, and a light-emitting region and thus can have a good design.

This application is based on Japanese Patent Application serial no. 2011-028871 filed with Japan Patent Office on Feb. 14, 2011, the entire contents of which are hereby incorporated by reference.

What is claimed is:

1. A lighting device comprising:
   a substrate;
   a light-emitting element formed over a first surface of the substrate; and
   a rear surface metal layer formed on a second surface of the substrate, which is opposite to the first surface of the substrate,
   wherein the light-emitting element comprises an organic compound layer containing a light-emitting substance between a pair of electrodes,
   wherein the substrate comprises at least one insulating layer and a first internal metal layer, where the insulating layer and the first internal metal layer are adjacent to each other in a direction in which they are stacked,
   wherein the first internal metal layer is thermally bonded to the rear surface metal layer through a first via hole formed in the insulating layer, and
   wherein the first via hole is filled with a material of which thermal conductivity is higher than that of a material of the insulating layer.

2. The lighting device according to claim 1, wherein the rear surface metal layer has an uneven surface.

3. The lighting device according to claim 1, wherein the rear surface metal layer is provided with a heat sink.

4. The lighting device according to claim 3, wherein the heat sink is thermally bonded to the rear surface metal layer with an insulating heat conductor provided therebetween, and
wherein an integrated circuit is provided so as to overlap with the heat sink, on a portion where the insulating heat conductor is not provided, when the substrate is seen from the direction perpendicular to the second surface.

5. The lighting device according to claim 1, wherein an insulating film is formed so as to cover the rear surface metal layer.

6. The lighting device according to claim 1, wherein the substrate is a printed circuit board.

7. The lighting device according to claim 1,
wherein the substrate further comprises a second internal metal layer thermally bonded to the first internal metal layer through a second via hole, where the insulating layer and the second internal metal layer are adjacent to each other in a direction in which they are stacked.

8. A lighting device comprising:
a substrate;
a light-emitting element formed over a first surface of the substrate; and
a rear surface metal layer formed on a second surface of the substrate, which is opposite to the first surface of the substrate,
wherein the light-emitting element comprises an organic compound layer containing a light-emitting substance is provided between a pair of electrodes,
wherein the substrate comprises at least one insulating layer and a first internal metal layer, where the insulating layer and the first internal metal layer are adjacent to each other in a direction in which they are stacked,
wherein the first internal metal layer is electrically connected to one of the electrodes of the light-emitting element,
wherein the first internal metal layer is thermally bonded to the rear surface metal layer through a via hole formed in the insulating layer, and
wherein the via hole is filled with a material of which thermal conductivity is higher than that of a material of the insulating layer.

9. The lighting device according to claim 8,
wherein the rear surface metal layer has an uneven surface.

10. The lighting device according to claim 8,
wherein the rear surface metal layer is provided with a heat sink.

11. The lighting device according to claim 10,
wherein the heat sink is thermally bonded to the rear surface metal layer with an insulating heat conductor provided therebetween, and
wherein an integrated circuit is provided so as to overlap with the heat sink, on a portion where the insulating heat conductor is not provided, when the substrate is seen from a direction perpendicular to the second surface.

12. The lighting device according to claim 8,
wherein an insulating film is formed so as to cover the rear surface metal layer.

13. The lighting device according to claim 8,
wherein the first internal metal layer, or the first internal metal layer and the rear surface metal layer are part of a wiring through which current is fed to the light-emitting element.

14. The lighting device according to claim 8,
wherein the substrate is a printed circuit board.

15. The lighting device according to claim 8,
wherein the substrate further comprises a second internal metal layer thermally bonded to the first internal metal layer through a second via hole, where the insulating layer and the second internal metal layer are adjacent to each other in a direction in which they are stacked.

16. A lighting device comprising:
a substrate comprising:
  a first internal metal layer;
  a second internal metal layer;
  a first insulating layer; and
  a second insulating layer;
a first light-emitting element formed over a first surface of the substrate;
a second light-emitting element formed over the first surface of the substrate;
a third light-emitting element formed over the first surface of the substrate;
a fourth light-emitting element formed over the first surface of the substrate;
a first rear surface metal layer formed on a second surface of the substrate, which is opposite to the first surface of the substrate; and
a second rear surface metal layer formed on the second surface of the substrate,
wherein the first internal metal layer is distant from the second internal metal layer with a space therebetween in a lateral direction perpendicular to a thickness direction of the substrate,
wherein the first internal metal layer and the second internal metal layer are located between the first insulating layer and the second insulating layer,
wherein the first insulating layer is in contact with the second insulating layer at the space between the first internal metal layer and the second internal metal layer,
wherein the first rear surface metal layer is distant from the second rear surface metal layer with a space therebetween in a lateral direction,
wherein each of the first light-emitting element, the second light-emitting element, the third light-emitting element, and the fourth light-emitting element comprises an organic compound layer containing a light-emitting substance between a pair of electrodes,
wherein the first internal metal layer is electrically connected to one of the electrodes of each of the first light-emitting element and the second light-emitting element,
wherein the second internal metal layer is electrically connected to one of the electrodes of each of the third light-emitting element and the fourth light-emitting element,
wherein the first internal metal layer is thermally bonded to the first rear surface metal layer through a first via hole formed in the second insulating layer,
wherein the second internal metal layer is thermally bonded to the second rear surface metal layer through a second via hole formed in the second insulating layer, and
wherein each of the first via hole and the second via hole is filled with a material of which thermal conductivity is higher than that of a material of the second insulating layer.

17. The lighting device according to claim 16,
wherein the first light-emitting element and the second light-emitting element are electrically connected to each other in parallel, and
wherein the third light-emitting element and the fourth light-emitting element are electrically connected to each other in parallel.

18. The lighting device according to claim 16,
wherein the first light-emitting element and the second light-emitting element are electrically connected to each other in series, and
wherein the third light-emitting element and the fourth light-emitting element are electrically connected to each other in series.

19. The lighting device according to claim 16,
wherein the substrate further comprises:
a third internal metal layer thermally bonded to the first internal metal layer through a third via hole formed in the first insulating layer, where the first insulating layer and the third internal metal layer are adjacent to each other in a direction in which they are stacked; and a fourth internal metal layer thermally bonded to the second internal metal layer through a fourth via hole formed in the first insulating layer, where the first insulating layer and the fourth internal metal layer are adjacent to each other in a direction in which they are stacked.

20. The lighting device according to claim 19,
wherein the space between the first internal metal layer and the second internal metal layer is completely covered by at least the first rear surface metal layer and the third internal metal layer,
wherein the space between the third internal metal layer and the fourth internal metal layer is completely covered by at least the first rear surface metal layer and the second internal metal layer, and
wherein the space between the first rear surface metal layer and the second rear surface metal layer is completely covered by at least the second internal metal layer and the fourth internal metal layer.

21. The lighting device according to claim 16,
wherein each of the first rear surface metal layer and the second rear surface metal layer has an uneven surface.

22. The lighting device according to claim 16,
wherein an external connection terminal is formed using a rear surface metal layer in the same layer as the first rear surface metal layer and the second rear surface metal layer.

23. The lighting device according to claim 16,
wherein the first rear surface metal layer and the second rear surface metal layer are provided with a heat sink.

24. The lighting device according to claim 23,
wherein the heat sink is thermally bonded to the first rear surface metal layer and the second rear surface metal layer with an insulating heat conductor provided therebetween, and
wherein an integrated circuit is provided so as to overlap with the heat sink, on a portion where the insulating heat conductor is not provided, when the substrate is seen from a direction perpendicular to the second surface.

25. The lighting device according to claim 16,
wherein an insulating film is formed so as to cover the first rear surface metal layer and the second rear surface metal layer.

26. The lighting device according to claim 16,
wherein the substrate is a printed circuit board.

27. A lighting device comprising:
a substrate comprising:
 a first internal metal layer;
 a second internal metal layer;
 a first insulating layer; and
 a second insulating layer;
a first light-emitting element formed over a first surface of the substrate;
a second light-emitting element formed over the first surface of the substrate;
a first rear surface metal layer formed on a second surface of the substrate, which is opposite to the first surface of the substrate; and
a second rear surface metal layer formed on the second surface of the substrate,
wherein the first internal metal layer is distant from the second internal metal layer with a space therebetween in a lateral direction perpendicular to a thickness direction of the substrate,
wherein the first internal metal layer and the second internal metal layer are located between the first insulating layer and the second insulating layer,
wherein the first insulating layer is in contact with the second insulating layer at the space between the first internal metal layer and the second internal metal layer,
wherein the first rear surface metal layer is distant from the second rear surface metal layer with a space therebetween in a lateral direction,
wherein each of the first light-emitting element and the second light-emitting element comprises an organic compound layer containing a light-emitting substance between a pair of electrodes,
wherein the first internal metal layer is electrically connected to one of the electrodes of the first light-emitting element,
wherein the second internal metal layer is electrically connected to one of the electrodes of the second light-emitting element,
wherein the first internal metal layer is thermally bonded to the first rear surface metal layer through a first via hole formed in the second insulating layer,
wherein the second internal metal layer is thermally bonded to the second rear surface metal layer through a second via hole formed in the second insulating layer, and
wherein each of the first via hole and the second via hole is filled with a material of which thermal conductivity is higher than that of a material of the second insulating layer.

28. The lighting device according to claim 27,
wherein the first light-emitting element and the second light-emitting element are electrically connected to each other in parallel.

29. The lighting device according to claim 27,
wherein the first light-emitting element and the second light-emitting element are electrically connected to each other in series.

30. The lighting device according to claim 27,
wherein the substrate further comprises:
a third internal metal layer thermally bonded to the first internal metal layer through a third via hole formed in the first insulating layer, where the first insulating layer and the third internal metal layer are adjacent to each other in a direction in which they are stacked; and
a fourth internal metal layer thermally bonded to the second internal metal layer through a fourth via hole formed in the first insulating layer, where the first insulating layer and the fourth internal metal layer are adjacent to each other in a direction in which they are stacked.

31. The lighting device according to claim 30,
wherein the space between the first internal metal layer and the second internal metal layer is completely covered by at least the first rear surface metal layer and the third internal metal layer,
wherein the space between the third internal metal layer and the fourth internal metal layer is completely covered by at least the first rear surface metal layer and the second internal metal layer, and
wherein the space between the first rear surface metal layer and the second rear surface metal layer is completely covered by at least the second internal metal layer and the fourth internal metal layer.

32. The lighting device according to claim 27,
wherein each of the first rear surface metal layer and the second rear surface metal layer has an uneven surface.

33. The lighting device according to claim 27,
wherein an external connection terminal is formed using a rear surface metal layer in the same layer as the first rear surface metal layer and the second rear surface metal layer.

34. The lighting device according to claim 27,
wherein the first rear surface metal layer and the second rear surface metal layer are provided with a heat sink.

35. The lighting device according to claim 34,
wherein the heat sink is thermally bonded to the first rear surface metal layer and the second rear surface metal layer with an insulating heat conductor provided therebetween, and
wherein an integrated circuit is provided so as to overlap with the heat sink, on a portion where the insulating heat conductor is not provided, when the substrate is seen from a direction perpendicular to the second surface.

36. The lighting device according to claim 27,
wherein an insulating film is formed so as to cover the first rear surface metal layer and the second rear surface metal layer.

37. The lighting device according to claim 27,
wherein the first internal metal layer and the second internal metal layer, or the first internal metal layer, the second internal metal layer, the first rear surface metal layer, and the second rear surface metal layer are part of wirings through which current are fed to the first light-emitting element and the second light-emitting element.

38. The lighting device according to claim 27,
wherein the substrate is a printed circuit board.

* * * * *